(12) United States Patent
Allen

(10) Patent No.: US 6,628,126 B2
(45) Date of Patent: Sep. 30, 2003

(54) OPTICAL VOLTAGE MEASUREMENT CIRCUIT AND METHOD FOR MONITORING VOLTAGE SUPPLIES UTILIZING IMAGING CIRCUIT ANALYSIS

(75) Inventor: David Howard Allen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 09/881,637

(22) Filed: Jun. 14, 2001

(65) Prior Publication Data

US 2002/0190735 A1 Dec. 19, 2002

(51) Int. Cl.[7] ....................... G01R 31/308; G01R 31/02
(52) U.S. Cl. ........................... 324/753; 324/763
(58) Field of Search .................. 324/750, 753, 324/763, 765, 768–770; 250/207, 216, 311, 559.07; 327/530, 534–537; 257/371, 48

(56) References Cited

U.S. PATENT DOCUMENTS

| | | | |
|---|---|---|---|
| 5,940,545 A | | 8/1999 | Kash et al. |
| 6,023,186 A | * | 2/2000 | Kuroda ........................ 327/534 |
| 6,075,234 A | * | 6/2000 | Patterson ..................... 250/207 |
| 6,172,512 B1 | | 1/2001 | Evans et al. |
| 6,466,041 B1 | * | 10/2002 | Egerer et al. ................ 324/753 |
| 6,476,633 B2 | * | 11/2002 | Yokomizo .................... 324/769 |
| 6,489,799 B1 | * | 12/2002 | Murakami ................... 324/765 |

\* cited by examiner

*Primary Examiner*—Kamand Cuneo
*Assistant Examiner*—Minh N. Tang
(74) *Attorney, Agent, or Firm*—Bracewell & Patterson LLP

(57) ABSTRACT

An optical voltage measurement circuit for use in an integrated circuit having at least one voltage power rail and method of operation thereof. The optical voltage measurement circuit includes a reference voltage rail that, in an advantageous embodiment, is coupled to an external variable power supply. The optical voltage measurement circuit also includes a switching device, such as a N-channel field effect transistor (NFET), that selectively couples the reference voltage rail to the voltage power rail to initiate a current flow therebetween, where the current flow generates an optical emission corresponding to a potential difference between the reference voltage and voltage power rails. In a related embodiment, the optical voltage measurement circuit further includes a current limiting resistor.

24 Claims, 3 Drawing Sheets

OPTICAL VOLTAGE MEASUREMENT CIRCUIT AND METHOD FOR MONITORING VOLTAGE SUPPLIES UTILIZING IMAGING CIRCUIT ANALYSIS

BACKGROUND OF THE INVENTION

1. Technical Field

The present invention relates in general to testing and verification of integrated circuits and, in particular, to monitoring voltage levels in an integrated circuit. More particularly, the present invention relates to an optical voltage measurement circuit for monitoring voltage levels in an integrated circuit utilizing imaging circuit analysis.

2. Description of the Related Art

The progress in integrated circuit (IC) technology has been characterized by substantial decreases in the size and spacing of active and passive structures such as transistors and their interconnecting wires, accompanied by increases in chip complexity, size, and speed of operation. Presently, these advances have also necessitated an increase in the number of metal layers connecting the devices within the chip, and chip inputs and outputs, or I/Os, that are needed to connect the different chips in a system and the use of "flip-chip" packaging methods. Dense "metal fill" patterns inserted in all areas not populated with signal wires are commonly used to optimize chemical-mechanical polishing processes. These layers of metal wiring are often referred to as the "back end of the line," or BEOL, portion of the IC fabrication process. This dense BEOL, especially when used in combination with flip-chip packaging, has created a situation in which the transistors in an IC and the signal-carrying metal lines are no longer physically accessible to external probes from the front side, without the destructive disassembly of the chip.

It is often necessary for IC designers and manufacturers to measure the voltages and/or currents deep inside an operating IC. This need can arise, for example, when a newly manufactured product is not performing up to specifications, or an IC is returned that has failed in the field. Currently, such measurements are carried out by means of two techniques. One uses an active or passive microscopic metal probe, which physically contacts a metal line of interest to extract an electrical signal. As an alternate to a physical probe, a focused beam of electrons may be used as a probe of the conducting lines.

The widespread use of a dense BEOL structure as well as flip-chip packaging poses a major challenge to these two techniques for measuring electrical activity in operating integrated circuits. Physical and electron-beam probing each require the metal line of interest to be at either an air-metal or vacuum-metal interface. A capacitively coupled form of electron-beam probing is possible that acquires signals through limited thicknesses of dielectric, but if the metal line is buried deep under other metal lines or thick insulators, or is covered because the chip is flipped over for packaging, neither measurement technique can be used without time-consuming and potentially destructive "deprocessing" of the chip. A further drawback is that all of the above probing techniques require signals to be acquired in a serial fashion, one at a time. For complex analysis efforts where little advanced knowledge of a failure or performance problem is available, this style of probing can be prohibitively time-consuming. Because physical and electron-beam probing are becoming less and less practical, there is a demand for new analytic tools utilizing optical inspection techniques that can "remotely" sense electrical activity in an integrated circuit through the back side (i.e., the substrate side) of a silicon IC. These imaging circuit analysis techniques, such as Picasecond Imaging Circuit Analysis (PICA), that utilize picosecond speeds of optical systems to track high-speed signals as they travel through particular gates in an IC. PICA, for example, collects the photons emitted from transistor channels in a IC during switching to form an image, or a collection of images, that is utilized to detect circuits that are switching erroneously, circuit that are failing to switch when they are supposed to, or to measure switching delays between various circuits.

One of the important characteristic of an integrated circuit to be aware of when trouble-shooting or characterizing the integrated circuit, e.g., following a failure, is the actual values of the supply power(s) present on the integrated circuit. Variations between power levels, such as a supply power (VDD) and a ground potential (GND), across the integrated circuit may manifest itself as signal noise, either AC or DC, on signals that originate in one part of the integrated circuit and which are utilized as inputs to circuits in a section of the integrated circuit. The resulting signal noise may result in erroneous operation and may even possibly induce failures in the circuits. For example, an increase or decrease in the difference between supply power and ground potentials may result in a circuit speeding up or, alternatively, slowing down its operation that, in turn, may result in a circuit failure. As discussed above, conventional image circuit analysis techniques, such as PICA, measure the photon emissions resulting from a transistor switching current and thus are not able to directly measure a potential voltage on an integrated circuit.

Accordingly, what is needed in the art is an improved method and circuit utilized in conjunction with imaging circuit analysis systems, such as PICA, that mitigates the limitations discussed above. More particularly, what is needed in the art is a circuit that allow for non-invasive monitoring and determination of supply voltages on an integrated circuit utilizing imaging circuit analysis methodologies.

SUMMARY OF THE INVENTION

It is therefore an object of the invention to provide an improved method for monitoring voltage levels in an integrated circuit.

It is another object of the invention to provide an optical voltage measurement circuit for monitoring voltage levels in an integrated circuit utilizing imaging circuit analysis.

To achieve the foregoing objects, and in accordance with the invention as embodied and broadly described herein, an optical voltage measurement circuit for use in an integrated circuit having at least one voltage power rail is disclosed. The optical voltage measurement circuit includes a reference voltage rail that, in an advantageous embodiment, is coupled to an external variable power supply. The optical voltage measurement circuit also includes a switching device, such as a N-channel field effect transistor (NFET), that selectively couples the reference voltage rail to the voltage power rail to initiate a current flow therebetween, where the current flow generates an optical emission corresponding to a potential difference between the reference voltage and voltage power rails. In a related embodiment, the optical voltage measurement circuit further includes a current limiting resistor.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
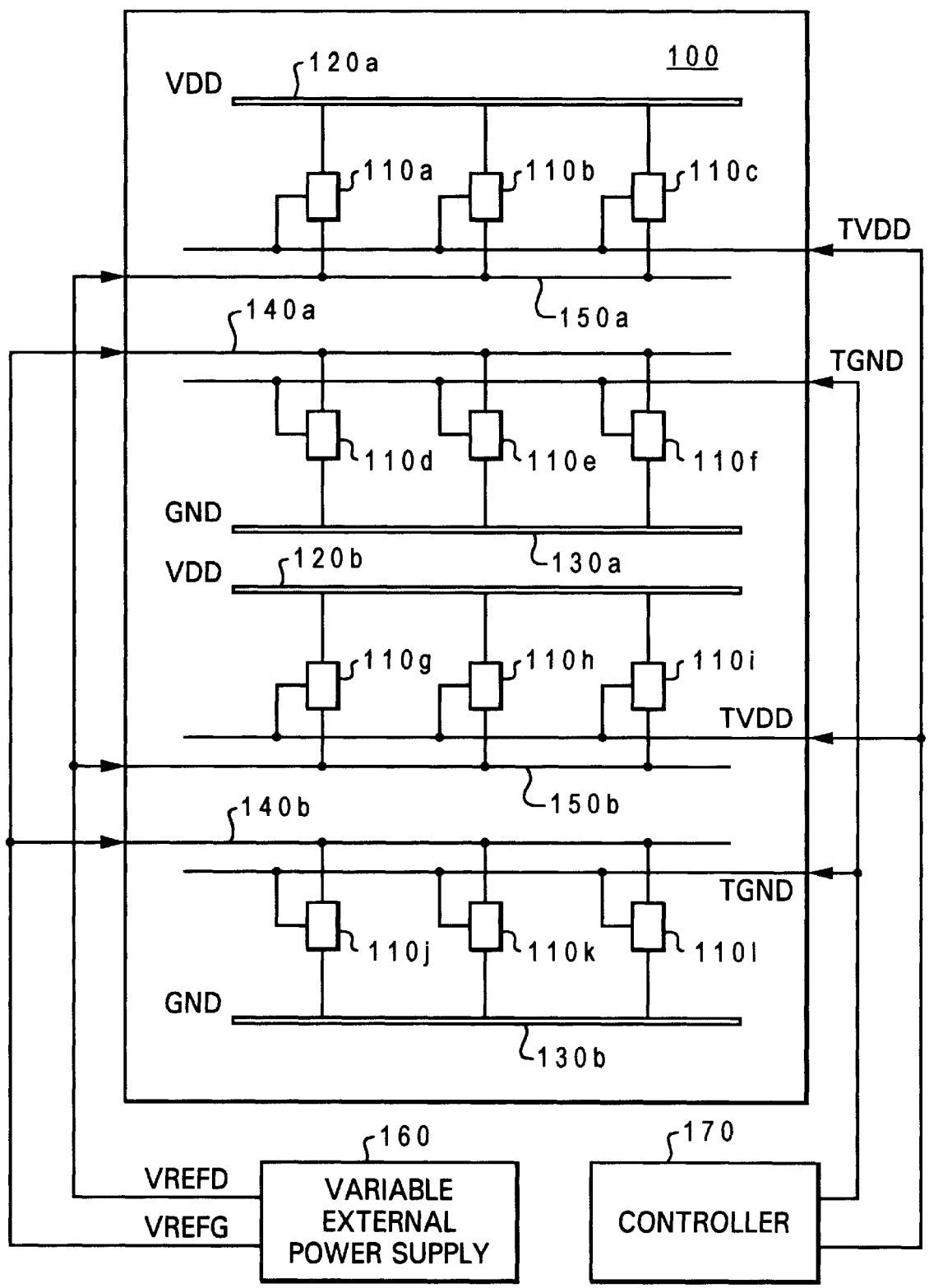
FIG. 1 illustrates an embodiment of an integrated circuit (IC) utilizing a plurality of optical voltage measurement circuits in accordance with the principles disclosed by the present invention.

With reference now to the figures and in particular with reference to FIG. 1, there is depicted an embodiment of an integrated circuit (IC) 100 utilizing a plurality of optical voltage measurement circuits, designated 110a–110l, in accordance with the principles disclosed by the present invention. As shown in the illustrated embodiment, IC 100 includes first and second voltage power rails 120a, 120b that provides supply power VDD to the internal components of IC 100 from an internal power supply (not shown). Also depicted in the illustrated embodiment, are a pair of ground power planes, i.e., first and second ground 130a, 130b that are, in an advantageous embodiment, at a ground potential GND of IC 100. IC 100 further includes a plurality of ground reference power rails, generally designated first and second ground references 140a, 140b and a plurality of voltage reference power rails, generally designated first and second voltage references 150a, 150b. A conventional external power supply 160 that, in an advantageous embodiment, is a multiple output, variable power supply provides the ground and voltage power references signals VREFG, VREFD to the voltage and ground reference power rails. Alternatively, in another embodiment, reference ground and voltage power signals VREFG, VREFD may be generated internally within IC 100.

In the preferred embodiment, reference power signal VREFD will be lower in value than supply power VDD and reference ground power signal VREFG will be higher in value than ground potential GND. It should be noted that reference voltage and ground power signals VREFD, VREFG may also be the actual power supply signal of opposite polarity. For example, reference ground power signal VREFG may be supply power VDD and reference power signal VREFD may be ground potential GND. This configuration will be the least intrusive implementation to an existing design, requiring the least amount of resources, such as wire, area, etc., to accomplish the implementation. Alternatively, in another embodiment, the two voltage supplies, i.e., supply power VDD and ground potential GND, may be combined into a single reference voltage supply, the potential of which would be somewhere between supply power VDD and ground potential GND, for example, (VDD-GND)/2).

IC 100 also includes plurality of optical voltage measurement circuits 110a–110l that are coupled between first and second ground 130a, 130b and first and second ground references 140a, 140b, respectively, and between first and second voltage power rails 120a, 120b and first and second voltage references 150a, 150b, respectively. Optical voltage measurement circuits 110a–100l are utilized to provide a means to indirectly monitor the value of the voltage supplies, i.e., VDD and GND, on IC 100 when employing a noninvasive optical measurement system, such as picosecond imaging circuit analysis (PICA). The construction and operation of an optical voltage measurement circuit will hereinafter be described in greater detail in FIGS. 2A and 2B, with continuing reference to FIG. 1.

Figure 2A:
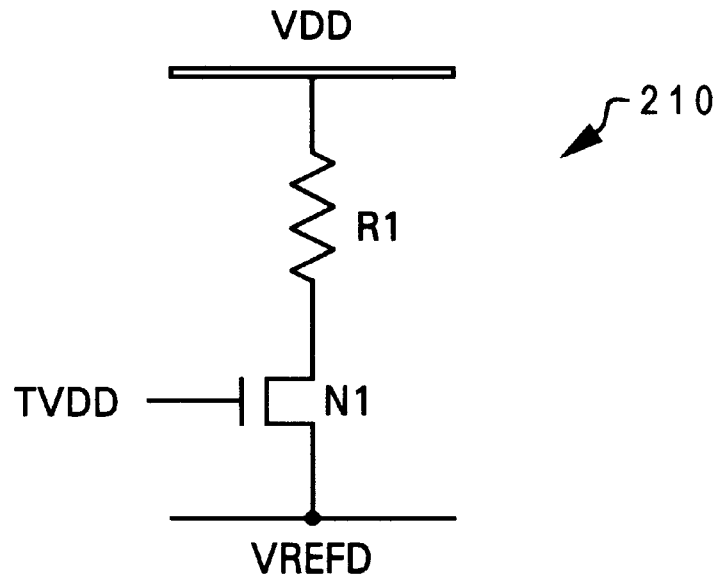
FIG. 2A illustrates a first embodiment of an optical voltage measurement circuit according to the principles disclosed by the present invention.
Figure 2B:
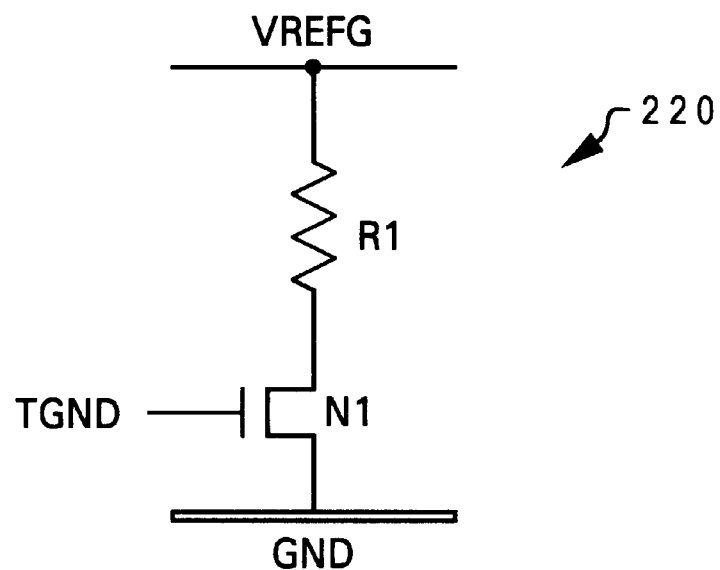
FIG. 2B illustrates a second embodiment of an optical voltage measurement circuit according to the principles disclosed by the present invention.

Referring now to FIGS. 2A and 2B, there are illustrated first and second embodiments of an optical voltage measurement circuit 210, 220 according to the principles disclosed by the present invention. As depicted in FIG. 2A, first embodiment of an optical voltage measurement circuit 210 includes a limiting resistor R1 coupled in series with a switching device N1. Although a N-channel field effect transistor (NFET) is depicted in the illustrated embodiment, the present invention does not contemplate limiting its practice to any one particular switching device. Optical voltage measurement circuit 210, in turn, is coupled between a reference power signal VREFD and a supply voltage under evaluation, i.e., supply power VDD. Similarly, as shown in FIG. 2B, optical voltage measurement circuit 220 also includes a limiting resistor R1 coupled in series with a switching device N1 and is connected between ground power signal VREFG and a voltage power rail under evaluation, i.e., ground potential GND. The operation of switching device N1 in both optical measurement circuits 210, 220 is controlled by a test signal (TVDD or TGND) that is generated, in an advantageous embodiment, through an external connection (shown but not referenced), or test pin, by an external controller such as a conventional personal computer. Alternatively, in another advantageous embodiment, the test signal may be generated by an external logic circuit or register, or by a similar device embedded in IC 100 that is dedicated to providing the test signal. In the illustrated embodiments, optical voltage measurement circuit 210 is controlled by a supply voltage test signal TVDD while optical voltage measurement circuit 220 is controlled by a ground voltage test signal TGND.

Figure 3:
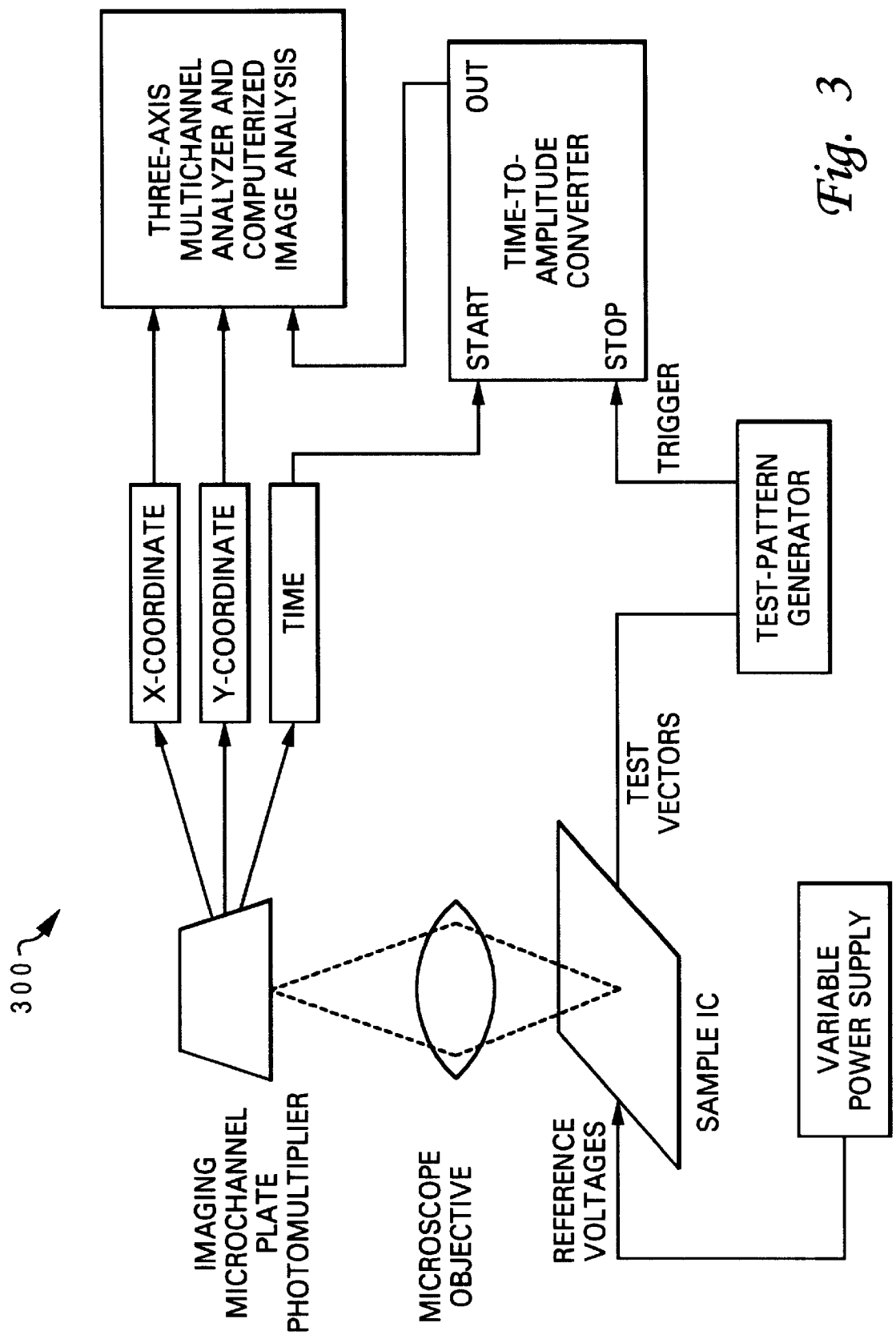
FIG. 3 illustrates an exemplary optical emission measurement system that may be advantageously utilized in conjunction with the present invention.

When supply voltage test signal TVDD goes high, a current flow is initiated between supply power VDD power rail and reference voltage power VREFD power rail through limiting resistor R1 and switching device N1. The size of the NFET utilized as switching device N1 and limiting resistor R1 value are chosen such that the current flowing the reference power rails and the voltage supply power rails is sufficiently small enough not to cause either of the reference or supply voltages to change significantly. It should be apparent to those skilled in the art that the exact value of switching device N1 and limiting resistor R1 is dependent on the supply and reference voltage supplies and distribution networks. Thus, depending on the implementation, the value of limiting resistor R1 may be zero. In this case, switching device N1 will be coupled directly between the supply and reference power rails. Current flowing through switching device N1 results in electron collisions with the silicon lattice in switching device N1 generating photon emissions. The detectable emission of light from gates of switching devices, such as switching device N1, is due to the short channel lengths of transistors and the voltages at which they operate. Carriers in a semiconductor are accelerated by an applied electric field and gain energy. In conventional field effect transistors (FETs), which are the building blocks of complementary metal oxide semiconductor (CMOS) technology, the applied electric field between the source and drain approach $10^6$ V/cm. Under such large fields, carriers may acquire sufficient energy to emit measurable amounts of light in both the visible and infrared regions of the spectrum. In the event that the applied field is moved, these "hot" carriers lose their excess energy in a very short period of time, e.g., a few picoseconds. As a result, this light emission is an instantaneous indicator of the presence of carriers in a high electric field. The photon emissions are then collected or captured, e.g., utilizing an optical emission measurement system for PICA, to generate an image whose intensity is related to the current flowing through switching device N1. While the photon emissions may be weak and unobservable by a human vision, it is sufficiently bright enough to be detected by highly sensitive optical detectors such as those utilized by modern astronomy. With these detectors, it is possible to measure the switching-induced light emissions and to determine its temporal properties. An exemplary optical emission measurement system 300 that may be advantageously utilized in conjunction with the present invention is depicted in FIG. 3. For a greater understanding of the operation and construction of optical emission measurement system 300, see U.S. Pat. No. 5,940,545 issued to Kash, et al., on Aug. 17, 1999, which is hereby incorporated in its entirety by reference.

As mentioned above, the intensity of the image obtained is dependent on the current flow through switching device N1. The resultant current flow, in turn, is a function of the difference between the voltage supply, i.e., VDD or GND, and the reference voltage, i.e., VREFD or VREFG. Therefore, with a known reference voltage value, the value of the voltage supply under evaluation can be accurately determined. An illustrative example of the utilization of the optical voltage measurement circuit of the present invention in conjunction with an optical emission circuit analysis system, such as PICA analyzer, is as follows. A reference image is first obtained by generating an image of the operation of IC 100 with the values of the supply and reference voltages at specifically controlled values, e.g., operating values of supply power VDD and ground potential GND. Additional reference images may also be obtained by varying the controlled values of the reference and supply voltages. The generated images are then stored in a "library" or table for future use. The value of the supply voltages at any time during the operation of IC 100 can be accurately determined by activating an optical voltage measurement circuit coupled to the supply voltage under consideration. An image of the current flow generated in the optical voltage measurement circuit is obtained and compared to the reference image(s) to determine if there is a difference between the two images. A "substantial" difference in image intensity between the two images would indicate that the supply voltage under consideration may be out of "specification" that, in turn, may indicate that a problem may exist in the supply voltage. Additionally, the image of the supply voltage under evaluation may also be compared to the reference images stored in the library to accurately determine the value of the supply voltage.

To effectively monitor the supply voltages across an integrated circuit, such as IC 100, a number of the optical voltage measurement circuit will be spread out throughout the integrated circuit as shown in FIG. 1. In a preferred embodiment, the optical voltage measurement circuits will be coupled to the major power supply busses on the integrated circuit since the voltage potential present at these points has the greatest effect on the largest number of circuits present in the integrated circuit. It should be noted that the particular placement of the optical voltage measurement circuits depend on the particular content and "floorplan" of a given integrated circuit design. For example, for ease of identification in a PICA image, the optical voltage measurement circuits may be placed at regular intervals, such as a grid, across the integrated circuit and/or the optical voltage measurement circuits may be isolated from other switching transistors present in the integrated circuit by an area or zone that does not contain any active circuits.

While the invention has been particularly shown and described with reference to a preferred embodiment, it will be understood by those skilled in the art that various changes in form and detail may be made therein without departing from the spirit and scope of the invention.

What is claimed is:

1. An optical voltage measurement circuit for use in an integrated circuit having at least one voltage power rail, comprising:

a reference voltage rail;

a switching device that selectively couples said reference voltage rail to said voltage power rail to initiate a current flow therebetween, wherein said current flow generating an optical emission corresponding to a potential difference between said reference voltage rail and said voltage power rail; and means for determining a value of supply voltage of said voltage power rail of said integrated circuit utilizing said potential difference determined by said optical emission.

2. The optical voltage measurement circuit as recited in claim 1, further comprising a current limiting resistor.

3. The optical voltage measurement circuit as recited in claim 1, wherein said switching device is a N-channel field effect transistor (NFET).

4. The optical voltage measurement circuit as recited in claim 1, wherein said reference voltage rail is coupled to a power supply and a voltage level of said reference voltage rail is variable.

5. The optical voltage measurement circuit as recited in claim 1, wherein said means for determining a value includes a table of power levels mapping intensity of optical emissions as reference images against corresponding voltage levels of said voltage power rail compiled by prior analysis.

6. The optical voltage measurement circuit as recited in claim 1, wherein said voltage power rail is at a ground potential of said integrated circuit.

7. The optical voltage measurement circuit as recited in claim 1, wherein said voltage power rail is coupled to an internal power supply of said integrated circuit.

8. A method for optically monitoring voltage levels of an integrated circuit power supply, said method comprising:

placing a switching device between a reference voltage rail and a voltage power rail of said integrated circuit;

selectively coupling said reference voltage rail and said voltage power rail to initiate a current flow therebetween, wherein said current flow generating an optical emission corresponding to a potential difference between said reference voltage rail and said voltage power rail;

measuring said optical emission, wherein a value of said optical emission is utilized to determine a corresponding value of one of said voltage levels.

9. The method as recited in claim 8, wherein said measuring said optical emission includes obtaining an image of said optical emission.

10. The method as recited in claim 9, further comprising:

generating a table of power levels mapping intensity of optical emissions as reference images against corresponding voltage levels of said voltage power rail compiled by prior analysis; and comparing said image of said optical emission with said reference images to find a match.

11. The method as recited in claim 10, further comprising indicating an incorrect voltage level in response to said image of said optical emission not matching said reference image.

12. The method as recited in claim 8, further comprising locating a current limiting resistor in series with said switching device and said integrated circuit's voltage power rail.

13. The method as recited in claim 8, wherein said switching device is a N-channel field effect transistor (NFET).

14. The method as recited in claim 8, wherein said reference voltage rail is coupled to an external power supply.

15. The method as recited in claim 8, wherein a voltage level of said reference voltage rail is variable.

16. The method as recited in claim 8, wherein said voltage power rail is at a ground potential of said integrated circuit.

17. The method as recited in claim 8, wherein said voltage power rail is coupled to an internal power supply of said integrated circuit.

18. An integrated circuit, comprising:

at least one voltage power rail;

a reference voltage rail; and at least one optical voltage measurement circuit, including:

a switching device that selectively couples said reference voltage rail to said voltage power rail to initiate a current flow therebetween, wherein said current flow generating an optical emission corresponding to a potential difference between said reference voltage rail and said voltage power rail, wherein a value of supply voltage of said voltage power rail of said integrated circuit is determined utilizing said potential difference corresponding to said optical emission.

19. The integrated circuit as recited in claim 18, wherein said optical measurement circuit further includes a current limiting resistor.

20. The integrated circuit as recited in claim 18, wherein said switching device is a N-channel field effect transistor (NFET).

21. The integrated circuit as recited in claim 18, wherein said reference voltage rail is coupled to an external power supply.

22. The integrated circuit as recited in claim 18, wherein a voltage level of said reference voltage rail is variable.

23. The integrated circuit as recited in claim 18, wherein said voltage power rail is at a ground potential of said integrated circuit.

24. The integrated circuit as recited in claim 18, wherein said voltage power rail is coupled to an internal power supply of said integrated circuit.

* * * * *